US008502227B2

(12) United States Patent
Yoshida et al.

(10) Patent No.: US 8,502,227 B2
(45) Date of Patent: Aug. 6, 2013

(54) ACTIVE MATRIX SUBSTRATE, DISPLAY DEVICE, METHOD FOR INSPECTING THE ACTIVE MATRIX SUBSTRATE, AND METHOD FOR INSPECTING THE DISPLAY DEVICE

(75) Inventors: Masahiro Yoshida, Osaka (JP); Takehiko Kawamura, Osaka (JP); Katsuhiro Okada, Osaka (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 379 days.

(21) Appl. No.: 13/055,029

(22) PCT Filed: May 11, 2009

(86) PCT No.: PCT/JP2009/058777

§ 371 (c)(1), (2), (4) Date: Jan. 20, 2011

(87) PCT Pub. No.: WO2010/010750

PCT Pub. Date: Jan. 28, 2010

(65) Prior Publication Data

US 2011/0127536 A1 Jun. 2, 2011

(30) Foreign Application Priority Data

Jul. 23, 2008 (JP) ................................ 2008-190148

(51) Int. Cl.
*H01L 29/04* (2006.01)

(52) U.S. Cl.
USPC ........................ 257/59; 257/72; 257/E29.273

(58) Field of Classification Search
None
See application file for complete search history.

(56) References Cited

U.S. PATENT DOCUMENTS 5,426,447 A 6/1995 Lee
5,742,074 A 4/1998 Takizawa et al.
6,111,620 A 8/2000 Nishiki et al.

(Continued)

FOREIGN PATENT DOCUMENTS

JP 9-311341 12/1997
JP 9-329796 12/1997

(Continued)

OTHER PUBLICATIONS

Russian Office Action issued in Application No. 2011106755/08(009600) dated Jun. 21, 2012 with English Translation.

(Continued)

*Primary Examiner* — Michael Lebentritt
*Assistant Examiner* — Kevin Quinto
(74) *Attorney, Agent, or Firm* — Nixon & Vanderhye, P.C.

(57) ABSTRACT

An active matrix substrate (2) is provided with first connecting wirings (64$_1$, 64$_3$, 64$_5$, 64$_7$) connected to gate terminals (51) to which extraction wirings (61$_1$, 61$_3$, 61$_5$, 61$_7$) are connected, second connecting wirings (64$_2$, 64$_4$, 64$_6$) connected to gate terminals (51) to which extraction wirings (61$_2$, 61$_4$, 61$_6$) are connected, bundled wirings (65$_1$ to 65$_4$) each composed of a mutually adjacent first connecting wiring and second connecting wiring bunched together, a first inspection wiring (66) capable of inputting an inspection signal to bunched wirings (65$_2$, 65$_4$) that are not adjacent to each other among the bundled wirings, and a second inspection wiring (67) capable of inputting an inspection signal to bundled wirings (65$_1$, 65$_3$) that are not adjacent to each other and not connected to the first inspection wiring (66) among the bundled wirings.

12 Claims, 6 Drawing Sheets

U.S. PATENT DOCUMENTS

| | | | | |
|---|---|---|---|---|
| 2004/0012744 | A1 | 1/2004 | Ishige et al. | |
| 2004/0051836 | A1 | 3/2004 | Jung et al. | |
| 2004/0095549 | A1 | 5/2004 | Moon | |
| 2005/0056833 | A1 | 3/2005 | Kim | |
| 2006/0138461 | A1 | 6/2006 | Abe et al. | |
| 2010/0006838 | A1 | 1/2010 | Yoshida et al. | |
| 2011/0018142 | A1* | 1/2011 | Kawamura et al. | 257/776 |

FOREIGN PATENT DOCUMENTS

| | | |
|---|---|---|
| JP | 11-119683 | 4/1999 |
| JP | 2002-90424 | 3/2002 |
| JP | 2002-341377 | 11/2002 |
| RU | 2 160 933 C2 | 12/2000 |

OTHER PUBLICATIONS

Supplementary European Search Report issued in European Application No. 09800266.0, dated Nov. 22, 2011.

International Search Report for PCT/JP2009/058777, mailed Jun. 16, 2009.

* cited by examiner

ACTIVE MATRIX SUBSTRATE, DISPLAY DEVICE, METHOD FOR INSPECTING THE ACTIVE MATRIX SUBSTRATE, AND METHOD FOR INSPECTING THE DISPLAY DEVICE

This application is the U.S. national phase of International Application No. PCT/JP2009/058777, filed 11 May 2009, which designated the U.S. and claims priority to JP Application No. 2008-190148, filed 23 Jul. 2008, the entire contents of each of which are hereby incorporated by reference.

TECHNICAL FIELD

The present invention relates to an active matrix substrate having two or more layers, with a plurality of first extraction wirings respectively connecting a plurality of first wirings formed parallel to each other in a display region and a plurality of first terminals arranged in a terminal arrangement region being formed on the respective layers, a display device, a method for inspecting the active matrix substrate, and a method for inspecting the display device.

BACKGROUND ART

In recent years, liquid crystal panels have been widely used in a variety of electronic devices such as mobile phones, PDAs, car navigation systems and personal computers. Liquid crystal panels are characterized by being thin, lightweight and power efficient. As for methods of mounting drivers on such liquid crystal panels, a so-called COG (Chip On Glass) method that involves directly mounting a driver on one (active matrix substrate) of a pair of substrates opposing each other across a liquid crystal material is known (e.g., see JP 9-329796A, JP 8-328033A). Using this COG method enables liquid crystal panels to be made thinner, smaller and lighter, and with higher definition between wirings and terminals.

Also, the vertical and horizontal pixel count of the display screens of liquid crystal panels used in compact electronic devices such as mobile phones and PDAs has transitioned in recent years from 160×120 QQVGA and 176×14-4 QCIF to 320×240 QVGA and even 640×480 VGA. This has lead to an increase in the number of wirings and terminals that ought to be formed on an active matrix substrate constituting a liquid crystal panel. However, in order to address the demand for more compact and higher definition liquid crystal panels, the size of the active matrix substrate cannot be increased.

In view of this an active matrix substrate on which a plurality of extraction wirings respectively connecting a plurality of gate wirings formed in a display region and a plurality of gate terminals arranged in a terminal arrangement region are formed on two or more layers (multi-layers) is known (e.g., see JP 2004-53702A, JP 2005-91962A). Specifically, a prescribed number of the plurality of extraction wirings are formed on the same layer (first layer) as the layer on which the gate wirings are formed, and the remaining extraction wirings are formed on a different layer (second layer) from the layer on which the gate wirings are formed. Note that an insulating material is interposed between the extraction wirings formed on the first layer and the extraction wirings formed on the second layer. Multi-layering the extraction wirings enables a more compact and higher definition liquid crystal panel to be realized without increasing the size of the active matrix substrate, since the spacing between the extraction wirings formed on the first layer and the extraction wirings formed on the second layer can be reduced.

DISCLOSURE OF THE INVENTION

Problem to be Solved by the Invention

Incidentally, because an insulating material is interposed between the extraction wirings formed on the first layer and the extraction wirings formed on the second layer, short circuits (leakage) are unlikely to occur between the extraction wirings formed on the first layer and the extraction wirings formed on the second layer. However, short circuits can occur between adjacent extraction wirings formed on the same layer, caused by dust in the photolithography process, etching residue or the like during manufacture of the active matrix substrate. In particular, in recent years, more compact and higher definition liquid crystal panels have been desired, as discussed above, increasing the likelihood of short circuits between adjacent extraction wirings formed on the same layer, since the spacing between wirings has been increasingly reduced in recent years. The importance of inspecting for short circuits between extraction wirings in the inspection process during manufacture or the like of active matrix substrates has thus increased. That is, in the mounting process, mounting a driver on a defective active matrix substrate in which a wiring short circuit has occurred results in a loss of material costs and operating costs.

However, despite the increasing importance of inspecting for short circuits between extraction wirings, a mechanism for detecting short circuits between adjacent extraction wirings formed on the same layer in relation to each of a plurality of layers in an active matrix substrate having two or more layers has not been established. Specifically, with a conventional active matrix substrate having two or more layers, the same inspection signal is input from the same inspection wiring to each of adjacent extraction wirings formed on the same layer, so while disconnection of extraction wirings can detected, short circuits between adjacent extraction wirings formed on the same layer cannot be detected.

The present invention has been made in consideration of the above problems, and has as its object to provide an active matrix substrate, a display device, a method for inspecting the active matrix substrate and a method for inspecting the display device that enable short circuits between adjacent extraction wirings formed on the same layer to be reliably detected in the case where extraction wirings are formed on each of a plurality of layers.

Means for Solving the Problem

In order to attain the above object, an active matrix substrate in the present invention includes a plurality of first wirings formed parallel to each other in a display region, a plurality of second wirings formed parallel to each other and so as to intersect the plurality of first wirings in the display region, a plurality of first terminals arranged in a terminal arrangement region, a plurality of second terminals arranged in the terminal arrangement region, a plurality of first extraction wirings respectively connecting the plurality of first wirings and the plurality of first terminals, and a plurality of second extraction wirings respectively connecting the plurality of second wirings and the plurality of second terminals. The plurality of first extraction wirings include a plurality of third extraction wirings and a plurality of fourth extraction wirings, the third extraction wirings being formed on the same layer as the layer on which the first wirings are formed, at least a portion of the fourth wirings being formed on a different layer from the layer on which the first wirings are formed with an insulating material sandwiched therebetween, and the third extraction wirings and the fourth extraction wirings being formed alternately per wiring in a peripheral wiring region that is other than the display region and the terminal arrangement region, and the active matrix substrate includes a plurality of first connecting wirings respectively connected to a plurality of first terminals to which the plurality of third extraction wirings are respectively connected, a plurality of second connecting wirings respectively connected to a plurality of first terminals to which the plurality of fourth extraction wirings are respectively connected, a plurality of bundled wirings each composed of a mutually adjacent first connecting wiring and second connecting wiring bundled together, a first common wiring commonly connecting bundled wirings that are not adjacent to each other among the plurality of bundled wirings, and a second common wiring commonly connecting bundled wirings that are not adjacent to each other and not connected to the first common wiring among the plurality of bundled wirings.

According to the active matrix substrate of the present invention, inspection signals can be input to the third extraction wirings and the fourth extraction wirings via the bundled wirings, the first connecting wirings and the second connecting wirings by inputting mutually independent inspection signals to the first common wiring and the second common wiring, in an inspection process during manufacture or the like of the active matrix substrate. That is, mutually independent inspection signals can be input to adjacent third extraction wirings. Note that the third extraction wirings are formed on the same layer as the layer on which the first wirings are formed. Short circuits between adjacent third extraction wirings can thereby be detected. Mutually independent inspection signals can also be input to adjacent fourth extraction wirings. Note that at least a portion of the fourth extraction wirings is formed on a different layer from the layer on which the first wirings are formed with an insulating material sandwiched therebetween. Short circuits between adjacent fourth extraction wirings can thereby be detected.

The active matrix substrate of the present invention is provided with a plurality of bundled wirings each composed of a mutually adjacent first connecting wiring and second connecting wiring bundled together, with each of the plurality of bundled wirings being connected to the first common wiring or the second common wiring. The space between wirings can thus be widened and the number of wiring-layer connecting portions for electrically connecting wirings formed on different layers can be reduced, in comparison with a mode in which each of the plurality of first connecting wirings and the plurality of second connecting wirings are directly connected to the first common wiring or the second common wiring without providing bundled wirings. That is, short circuits between wirings are unlikely to occur because the spacing between wirings (between bundled wirings) can be widened. Also, connection failures and the like in the wiring-layer connecting portions can be reduced because of being able to reduce the number of wiring-layer connecting portions.

As a result, in the case where extraction wirings are formed on each of a plurality of layers, short circuits between adjacent extraction wirings formed on the same layer can be reliably detected with a simple configuration.

In order to attain the above object, a display device in the present invention is provided with an active matrix substrate according to the present invention. Note that the display device preferably is a liquid crystal display device.

In order to attain the above object, a method for inspecting an active matrix substrate or a display device in the present invention is a method for inspecting the above active matrix substrate or a display device provided with the above active matrix substrate including a process of inspecting the third extraction wirings and the fourth extraction wirings by inputting mutually independent inspection signals to the first common wiring and the second common wiring, and a process of cutting off the plurality of first connecting wirings and the plurality of second connecting wirings after the inspection step.

According to the method for inspecting an active matrix substrate or a display device of the present invention, short circuits between adjacent third extraction wirings and short circuits between adjacent fourth extraction wirings can be detected, by inputting mutually independent inspection signals to the first common wiring and the second common wiring. The plurality of first connecting wirings and the plurality of second connecting wirings are then cut off in the cutting off process. The plurality of first terminals to which the plurality of third extraction wirings are respectively connected are thereby electrically separated from the plurality of first terminals to which the plurality of fourth extraction wirings are respectively connected.

Effects of the Invention

As described above, an active matrix substrate, a display device and a method for inspecting the active matrix substrate of the present invention accomplish the effect of enabling short circuits between adjacent extraction wirings formed on the same layer to be reliably detected with a simple configuration in the case where extraction wirings are formed on each of a plurality of layers.

BEST MODE FOR CARRYING OUT THE INVENTION

Figure 1:
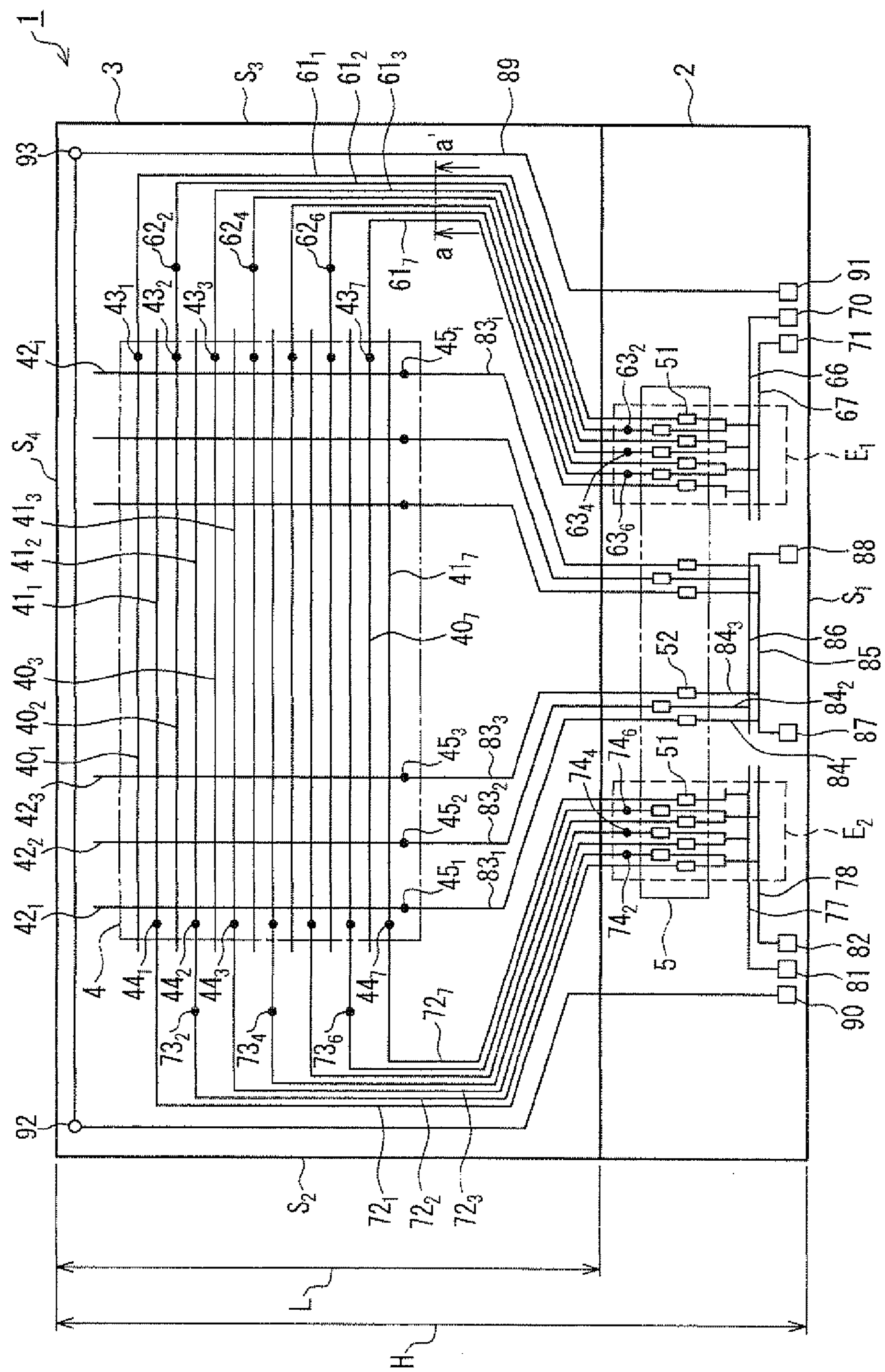
FIG. 1 is a plan view showing a schematic configuration of a liquid crystal panel according to Embodiment 1 of the present invention.

In the embodiments of the present invention, a mode preferably is adopted in which the plurality of first connecting wirings and the plurality of second connecting wirings are cut off, such that electrical continuity is not established between the plurality of first terminals to which the plurality of third extraction wirings are respectively connected and the plurality of first terminals to which the plurality of fourth extraction wirings are respectively connected. This mode results in the plurality of first terminals to which the plurality of third extraction wirings are respectively connected being electrically separated from the plurality of first terminals to which the plurality of fourth extraction wirings are respectively connected.

In the embodiments of the present invention, a mode preferably is adopted in which a resistance element is connected to at least one of a mutually adjacent first connecting wiring and second connecting wiring. In particular, a mode preferably is adopted in which a resistance element is connected to each of the mutually adjacent first connecting wiring and second connecting wiring. This mode enables the bundled wirings to be cut off instead of the first connecting wirings and the second connecting wirings in a cutting off process during manufacture or the like of the active matrix substrate. In other words, the number of wirings to be cut off is fewer than in the case of cutting off the first connecting wirings and the second connecting wirings. As a result, the time taken in the cutting off process can be reduced. Also, the space between wirings to be cut off can be widened, enabling a reduction in the occurrence of failures such as adjacent wirings short circuiting due to cut-off debris produced during cutting off.

In the embodiments of the present invention, a mode preferably is adopted in which the resistance element connected the first connecting wiring and the resistance element connected the second connecting wiring have substantially the same resistance value. This mode enables the delay amounts of inspection signals to be input to extraction wirings corresponding the adjacent connecting wirings and to first wirings corresponding to the extraction wirings to be substantially equivalent, in the inspection process during manufacture or the like of the active matrix substrate. Failures can thereby be detected that, while not resulting in disconnection, occur in cases such as when the wiring width is extremely small.

In the embodiments of the present invention, a mode preferably is adopted in which each of the plurality of bundled wirings has been cut off. This mode results in the plurality of first terminals to which the plurality of third extraction wirings and the plurality of fourth extraction wirings are respectively connected being electrically separated from the first common wiring and the second common wiring.

In the embodiments of the present invention, a mode preferably is adopted in which the first wirings are gate wirings and the second wirings are source wirings. Here, in a mode in which the number of first wirings and the number of second wirings mutually differ, for example, short circuits between gate wirings, which have a high failure rate, can be detected if the first wirings are gate wirings, in the case where there are more first wirings than second wirings. The mounting of a driving circuit (driver) for gate wirings on a defective active matrix substrate in which a short circuit has occurred between gate wirings can thus be prevented. Thus, loss of material costs and operating costs can be reduced. Note that a driving circuit for gate wirings has a simple configuration in comparison with a driving circuit for source wirings that supplies source signals (video signals) corresponding to a plurality of gradations. In the case where there are more first wirings than second wirings with the aim of condensing the size of the terminal arrangement region and reducing the cost of active matrix substrates, the first wirings preferably are gate wirings and the second wirings preferably are source wirings.

In the embodiments of the present invention, a mode preferably is adopted in which the first wirings are source wirings and the second wirings are gate wirings. This mode enables inspection for short circuits between source wirings. That is, since a driving circuit (driver) for source wirings needs to supply source signals (video signals) corresponding to a plurality of gradations, the configuration is complex in comparison with a driving circuit (driver) for gate wirings. In other words, a driving circuit for source wirings is expensive in comparison with a driving circuit for gate wirings. The mounting of a driving circuit (driver) for source wirings on a defective active matrix substrate in which a short circuit has occurred between source wirings can thus be prevented. Thus, loss of material costs and operating costs can be reduced.

In the embodiment of the present invention, a mode preferably is adopted in which a method for inspecting an active matrix substrate according to the embodiments of the present invention or a display device provided with an active matrix substrate according to the embodiments of the present invention includes the processes of inspecting the third extraction wirings and the fourth extraction wirings by inputting mutually independent inspection signals to the first common wiring and the second common wiring, and cutting off the plurality of bundled wirings after the inspection process. This mode enables short circuits between adjacent third extraction wirings and short circuits between adjacent fourth extraction wirings to be detected by inputting mutually independent inspection signals to the first common wiring and the second common wiring. The plurality of bundled wirings are then cut off in the cutting off process. The first terminals to which the plurality of third extraction wings and the plurality of fourth extraction wirings are respectively connected are thereby electrically separated from the first common wiring and the second common wiring.

Hereinafter, the embodiments of the present invention will be described with reference to the drawings. In the drawings referred to hereinafter, however, for ease of description only the principal members required in order to describe the present invention are shown in simplified form, among the constituent members of the embodiments of the present invention. Accordingly, an active matrix substrate according to the present invention can be provided with arbitrary constituent members that are not shown in the drawings referred to in the present specification. Also, the dimensions of members in the drawings are not intended to faithfully represent the actual dimensions of the constituent members or the dimensional proportions of the members.

The above first and second common wirings will be described in the present embodiment as a first inspection wiring and a second inspection wiring.

Embodiment 1

FIG. 1 is a plan view showing a schematic configuration of a liquid crystal panel 1 according to the present embodiment. As shown in FIG. 1, the liquid crystal panel 1 is provided with an active matrix substrate 2 and an opposing substrate 3 that opposes the active matrix substrate 2. A liquid crystal material (not shown) is held sandwiched between the active matrix substrate 2 and the opposing substrate 3. Note that a color filter layer that includes R (red), G (green) and B (blue) color filters and a black matrix that prevents light from leaking between these color filters is formed on the opposing substrate 3 according to the present embodiment. Common electrodes are formed on the color filter layer.

Here, the liquid crystal panel 1 according to the present embodiment is employed in an electronic device for mobile terminals such as a mobile phone, a PDA (Personal Digital Assistant), a PHS (Personal Handy-phone System) or an HHT (Hand-Held Terminal), for example. Apart from an electronic device for mobile terminals, the liquid crystal panel 1 according to the present embodiment is also employed in an electronic device such as a game terminal, a car navigation system, a personal computer, a television, a video camera or a digital camera. Here, an electronic device provided with the liquid crystal panel 1 is one embodiment of a liquid crystal display device according to the present invention. Note that the active matrix substrate 2 according to the present embodiment may be provided in a panel (display device) other than the liquid crystal panel 1, such as a field emission display, a plasma display, an organic EL display, or an inorganic EL display.

The active matrix substrate 2 has a display region 4, a terminal arrangement region 5, and a peripheral wiring region 6 that is outside of the display region 4 and surrounds the display region 4. Note that, hereinafter, one side of the liquid crystal panel 1 will be denoted as a first side $S_1$ (lower side in FIG. 1), the sides on the left and right sandwiching this first side $S_1$ will be denoted respectively as a second side $S_2$ and a third side $S_3$, and the side opposing the first side $S_1$ will be denoted as a fourth side $S_4$.

Here, as shown in FIG. 1, a length H of the second side $S_2$ (third side $S_3$) of the active matrix substrate 2 is longer than a length L of the second side $S_2$ (third side $S_3$) of the opposing substrate 3. In the case where the active matrix substrate 2 and the opposing substrate 3 are adhered together via the liquid crystal material (not shown), the terminal arrangement region 5 of the active matrix substrate 2 will be positioned closer to first side $S_1$ than is the opposing substrate 3.

First gate wirings $\mathbf{40}_1$ to $\mathbf{40}_7$, second gate wirings $\mathbf{41}_1$ to $\mathbf{41}_7$, and source wirings $\mathbf{42}_1$, $\mathbf{42}_2$, $\mathbf{42}_3$, . . . $\mathbf{42}_i$ are formed in the display region 4. Here, the first gate wirings $\mathbf{40}_1$ to $\mathbf{40}_7$ respectively have input ends $\mathbf{43}_1$ to $\mathbf{43}_7$ for gate signals at one end. Also, the second gate wirings $\mathbf{41}_1$ to $\mathbf{41}_7$ respectively have input ends $\mathbf{44}_1$ to $\mathbf{44}_7$ for gate signals at an opposite end. Further, the source wirings $\mathbf{42}_1$, $\mathbf{42}_2$, $\mathbf{42}_3$, . . . $\mathbf{42}_i$ respectively have input ends $\mathbf{45}_1$, $\mathbf{45}_2$, $\mathbf{45}_3$, . . . $\mathbf{45}_i$ for source signals at one end.

In FIG. 1, for ease of description, seven first gate wirings $\mathbf{40}_1$ to $\mathbf{40}_7$ and seven second gate wirings $\mathbf{41}_1$ to $\mathbf{41}_7$ are shown, but the number of first gate wirings and second gate wirings to be formed in the display region 4 is actually greater than this. The number of first gate wirings and second gate wirings is, however, arbitrary and not particularly limited here.

Note that, hereinafter, only in the case where individual wirings need to be distinguished will description be given with the subscripts for distinguishing individual wirings attached, such as source wiring $\mathbf{42}_1$, for example, and in the case where individual wirings do not particularly need to be distinguished or in the case where the wirings are referred to collectively, description will be given without attaching the subscripts, such as source wirings 42, for example. Also, hereinafter, in cases where the first gate wirings $\mathbf{40}_1$ to $\mathbf{40}_7$ and the second gate wirings $\mathbf{41}_1$ to $\mathbf{41}_7$ do not need to be distinguished or are referred to collectively, description will refer simply to gate wirings 40 and 41.

Here, in the present embodiment, the first gate wirings $\mathbf{40}_1$ to $\mathbf{40}_7$ and the second gate wirings $\mathbf{41}_1$ to $\mathbf{41}_7$ are formed in the display region 4 alternately per wiring and so as to be parallel to each other. That is, the gate wirings 40 and 41 are formed in the display region 4 so as to be arranged from the fourth side $S_4$ toward the first side $S_1$ as follows: first gate wiring $\mathbf{40}_1$, second gate wiring $\mathbf{41}_1$, first gate wiring $\mathbf{40}_2$, second gate wiring $\mathbf{41}_2$, first gate wiring $\mathbf{40}_3$, second gate wiring $\mathbf{41}_3$, and so on. The source wirings $\mathbf{42}_1$, $\mathbf{42}_2$, $\mathbf{42}_3$, . . . $\mathbf{42}_i$ are formed in the display region 4 parallel to each other and so as to intersect the gate wirings 40 and 41.

In the present embodiment, the source wirings 42 are formed in the display region 4 per RGB. In other words, source wirings 42 for R, source wirings 42 for G and source wirings 42 for B are formed in the display region 4. In the case of a monochrome liquid crystal panel 1, however, the present invention is not limited thereto. Further, apart from the gate wirings 40 and 41 and the source wirings 42, storage capacitor wirings (not shown) are formed in the display region 4. The storage capacitor wirings are formed in the display region 4 so as to be parallel to the gate wirings 40 and 41.

Note that switching elements such as TFTs (Thin Film Transistors) or MIM (Metal Insulator Metal) (not shown) and picture element electrodes (R, G or B) (not shown) connected to these switching elements are formed at the intersecting portions of the gate wirings 40 and 41 and the source wirings 42.

The terminal arrangement region 5 is a region in which a plurality of gate terminals 51 and a plurality of source terminals 52 are arranged on the active matrix substrate 2. A driver or a flexible wiring substrate provided with a driver is electrically connected to the gate terminals 51 and the source terminals 52 in the terminal arrangement region 5. The gate terminals 51 are thus terminals to which gate signals can be input from the driver. The source terminals 52 are terminals to which source signals can be input from the driver. Note that a driver can be connected in the terminal arrangement region 5 with a COG (Chip on Glass) method. Also, a flexible wiring substrate provided with a driver can be connected in the terminal arrangement region 5 with a TCP (Tape Carrier Package) method. Note that the connection method is not particularly limited here.

Note that FIG. 1 shows an example in which a single driver can be disposed in the terminal arrangement region 5, but the present invention is not limited thereto. For example, by providing a plurality of terminal arrangement regions 5 on the active matrix substrate 2, a configuration may be adopted in which a plurality of drivers can be disposed in each of the plurality of terminal arrangement regions 5.

Right-side gate extraction wirings (first extraction wirings) $\mathbf{61}_1$ to $\mathbf{61}_7$ respectively connecting the gate terminals 51 and the input ends $\mathbf{43}_1$ to $\mathbf{43}_7$ for gate signals provided at one end of the first gate wirings $\mathbf{40}_1$ to $\mathbf{40}_7$ are formed in the peripheral wiring region 6. That is, the right-side gate extraction wirings $\mathbf{61}_1$ to $\mathbf{61}_7$ are extracted from the input ends $\mathbf{43}_1$ to $\mathbf{43}_7$ for gate signals toward the third side $S_3$, formed in the peripheral wiring region 6 along the third side $S_3$, and connected to the gate terminals 51.

Here, the right-side gate extraction wirings $\mathbf{61}_1$ to $\mathbf{61}_7$ include first right-side gate extraction wirings (third extraction wirings) $\mathbf{61}_1$, $\mathbf{61}_3$, $\mathbf{61}_5$ and $\mathbf{61}_7$ and second right-side gate extraction wirings (fourth extraction wirings) $\mathbf{61}_2$, $\mathbf{61}_4$ and $\mathbf{61}_6$. The first right-side gate extraction wirings $\mathbf{61}_1$, $\mathbf{61}_3$, $\mathbf{61}_5$ and $\mathbf{61}_7$ are extraction wirings formed on the same layer as the layer on which the gate wirings 40 and 41 are formed. Note that, hereinafter, the layer on which the gate wirings 40 and 41 are formed will be referred to as a "first layer". The second right-side gate extraction wirings $\mathbf{61}_2$, $\mathbf{61}_4$ and $\mathbf{61}_6$ are extraction wirings of which at least a portion thereof is formed on a different layer from the layer (first layer) on which the gate wirings 40 to 41 are formed with an insulating material sandwiched therebetween. Note that, hereinafter, the different layer from the layer on which the gate wirings 40 and 41 are formed will be referred to as a "second layer". In other words, the source wirings 42 are formed on the second layer.

Here, the second right-side gate extraction wirings $\mathbf{61}_2$, $\mathbf{61}_4$ and $\mathbf{61}_6$ respectively have first wiring-layer connecting portions $\mathbf{62}_2$, $\mathbf{62}_4$ and $\mathbf{62}_6$ formed in proximity to the input ends $\mathbf{43}_2$, $\mathbf{43}_4$ and $\mathbf{43}_6$ for gate signals, and second wiring-layer connecting portions $\mathbf{63}_2$, $\mathbf{63}_4$ and $\mathbf{63}_6$ formed in proximity to the gate terminals 51. In the present embodiment, wiring of the second right-side gate extraction wirings $\mathbf{61}_2$, $\mathbf{61}_4$ and $\mathbf{61}_6$ between the input ends $\mathbf{43}_2$, $\mathbf{43}_4$ and $\mathbf{43}_6$ for gate signals and first wiring-layer connecting portions $\mathbf{62}_2$, $\mathbf{62}_4$ and $\mathbf{62}_6$ is formed on the first layer, wiring between the first wiring-layer connecting portions $\mathbf{62}_2$, $\mathbf{62}_4$ and $\mathbf{62}_6$ and the second wiring-layer connecting portions $63_2$, $63_4$ and $63_6$ is formed on the second layer, and wiring between the second wiring-layer connecting portions $63_2$, $63_4$ and $63_6$ and the gate terminals 51 is formed on the first layer. That is, wiring formed on the first layer and wiring formed on the second layer are respectively electrically connected to the first wiring-layer connecting portions $62_2$, $62_4$ and $62_6$ and the second wiring-layer connecting portions $63_2$, $63_4$ and $63_6$.

Note that as for the method for electrically connecting the wiring, the wiring formed on the first layer and the wiring formed on the second layer may be directly connected via contact holes formed in the insulating material, or the wiring formed on the first layer and the wiring formed on the second layer may be electrically connected via electrodes further formed on a separate layer. That is, as far as the method for electrically connecting the wiring is concerned, various arbitrary methods can be used, with the method not being particularly limited here. Also, the positions of the first wiring-layer connecting portions $62_2$, $62_4$ and $62_6$ and the second wiring-layer connecting portions $63_2$, $63_4$ and $63_6$ are arbitrary and not intended to be limited to the positions shown in FIG. 1.

Figure 2:
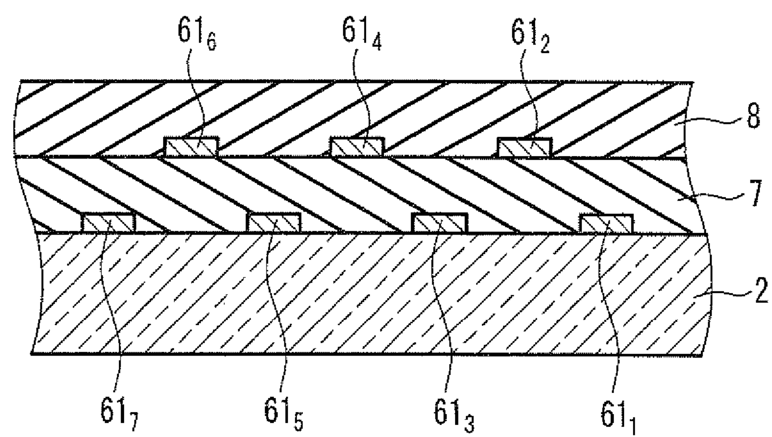
FIG. 2 is a cross-sectional view sectioned along a section line a-a' shown in FIG.

FIG. 2 is a cross-sectional view sectioned along a section line a-a' shown in FIG. 1. As shown in FIG. 2, the first right-side gate extraction wirings $61_1$, $61_3$, $61_5$ and $61_7$ are formed as a first layer on the active matrix substrate 2. An insulating film (insulating material) 7 is formed on the active matrix substrate 2, so as to cover the first right-side gate extraction wirings $61_1$, $61_3$, $61_5$ and $61_7$. The second right-side gate extraction wirings $61_2$, $61_4$ and $61_6$ are formed as a second layer on the insulating film 7. Further, a protective film 8 is formed on the insulating film 7, so as to cover the second right-side gate extraction wirings $61_2$, $61_4$ and $61_6$. That is, the insulating film 7 is interposed between the first right-side gate extraction wirings $61_1$, $61_3$, $61_5$ and $61_7$ and the second right-side gate extraction wirings $61_2$, $61_4$ and $61_6$.

Thus, in the present embodiment, the first right-side gate extraction wirings $61_1$, $61_3$, $61_5$ and $61_7$ are formed on the first layer and at least a portion of the second right-side gate extraction wirings $61_2$, $61_4$ and $61_6$ is formed on the second layer. A more compact and higher definition active matrix substrate can thus be realized in comparison with a mode in which all of the right-side gate extraction wirings $61_1$ to $61_7$ are formed on a single layer.

Figure 3:
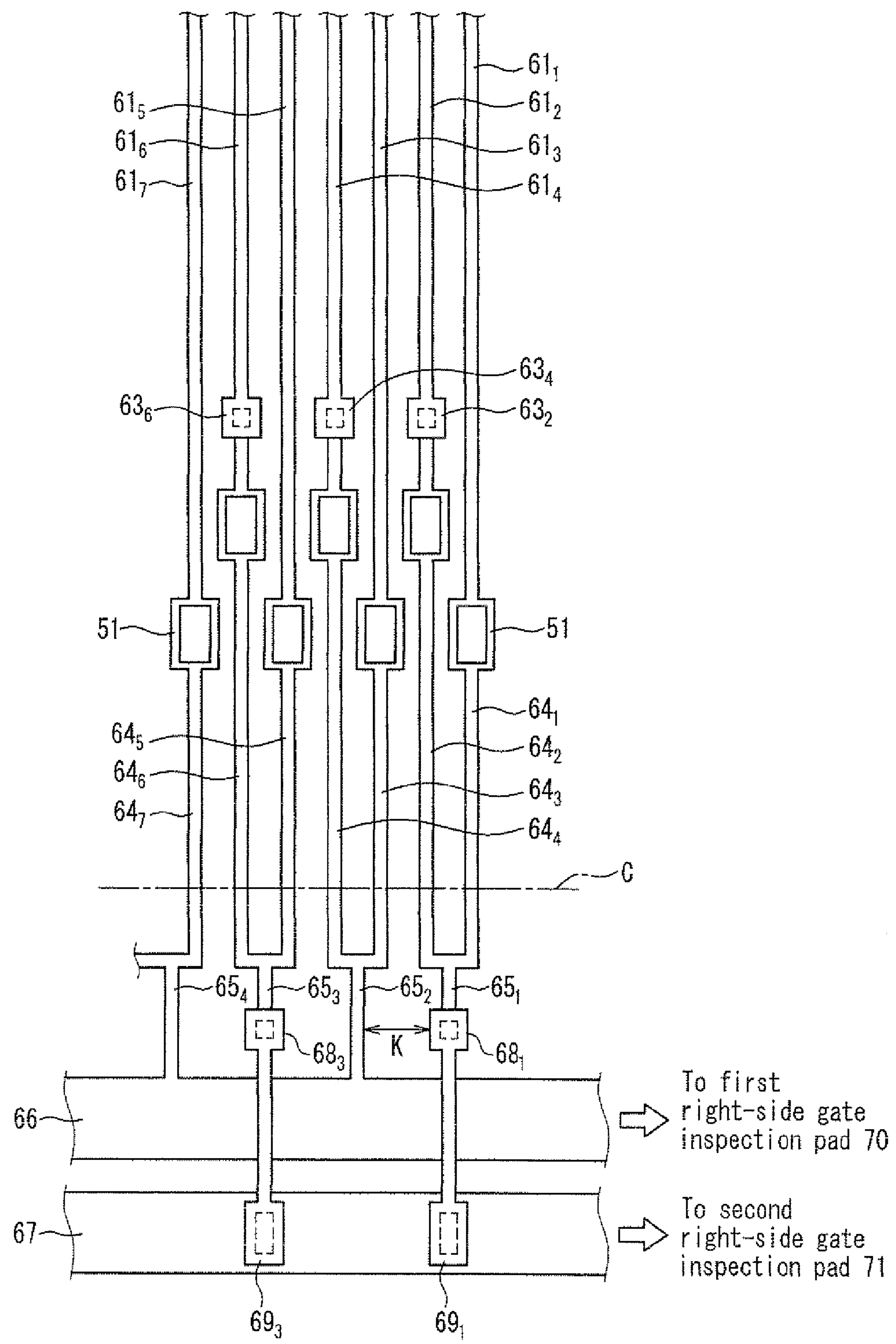
FIG. 3 is an enlarged view of an $E_1$, portion shown in FIG. 1.

FIG. 3 is an enlarged view of an $E_1$ portion shown in FIG. 1. As shown in FIG. 3, right-side gate connecting wirings $64_4$ to $64_7$ are further respectively connected to the plurality of gate terminals 51 to which the right-side gate extraction wirings $61_1$ to $61_7$ are connected. That is, the right-side gate connecting wirings $64_4$ to $64_7$ are respectively extracted from the plurality of gate terminals 51 toward the first side $S_1$ (in proximity to inspection wirings 66 and 67 described later).

Here, the right-side gate connecting wirings $64_1$ to $64_7$ include first right-side gate connecting wirings (first connecting wirings) $64_1$, $64_3$, $64_5$ and $64_7$ and second right-side gate connecting wirings (second connecting wirings) $64_2$, $64_4$ and $64_6$. The first right-side gate connecting wirings $64_1$, $64_3$, $64_5$ and $64_7$ are connecting wirings that are connected to gate terminals 51 to which the first right-side gate extraction wirings $61_1$, $61_3$, $61_5$ and $61_7$ are connected. The second right-side gate connecting wirings $64_2$, $64_4$ and $64_6$ are connecting wirings that are connected to gate terminals 51 to which the second right-side gate extraction wirings $61_2$, $61_4$ and $61_6$ are connected. Right-side bundled wirings (bundled wirings) $65_1$ to $65_4$ each composed of a mutually adjacent first right-side gate connecting wiring and second right-side gate connecting wiring bundled together are formed in the peripheral wiring region 6. In the present embodiment, the right-side bundled wiring $65_1$ bundles two wirings, namely, the first right-side gate connecting wiring $64_1$ and the second right-side gate connecting wiring $64_2$ into a single wiring. Also, the right-side bundled wiring $65_2$ bundles the first right-side gate connecting wiring $64_3$ and the second right-side gate connecting wiring $64_4$ into a single wiring. Further, the right-side bundled wiring $65_3$ bundles the first right-side gate connecting wiring $64_5$ and the second right-side gate connecting wiring $64_6$ into a single wiring. Note that the right-side bundled wiring $65_4$ is only connected to a single wiring, namely, the first right-side gate connecting wiring $64_7$.

A first right-side gate inspection wiring 66 is further connected to the right-side bundled wirings $65_2$ and $65_4$. Also, a second right-side gate inspection wiring 67 is connected to the right-side bundled wirings $65_1$ and $65_3$, over the first right-side gate inspection wiring 66. That is, the first right-side gate inspection wiring 66 is an inspection wiring capable of inputting an inspection signal to the non-adjacent right-side bundled wirings $65_2$ and $65_4$ among the right-side bundled wirings $65_1$ to $65_3$. The second right-side gate inspection wiring 67 is an inspection wiring capable of inputting an inspection signal to the non-adjacent right-side bundled wirings $65_1$ and $65_3$ that are not connected to the first right-side gate inspection wiring 66 among the right-side bundled wirings $65_1$ to $65_4$.

Note that because the second right-side gate inspection wiring 67 is connected to the right-side bundled wirings $65_1$ and $65_3$ across the first right-side gate inspection wiring 66, the right-side bundled wirings $65_1$ and $65_3$ respectively have third wiring-layer connecting portions $68_1$ and $68_3$ and fourth wiring-layer connecting portions $69_1$ and $69_3$. That is, the right-side bundled wirings $65_1$ and $65_3$ and the second right-side gate inspection wiring 67 are respectively electrically connected to the fourth wiring-layer connecting portions $69_1$ and $69_3$.

A first right-side gate inspection pad 70 is further connected to the first right-side gate inspection wiring 66. The first right-side gate inspection pad 70 is a pad to which an inspection signal can be input. An inspection signal can thereby be input to the right-side gate extraction wirings $61_3$, $61_4$ and $61_7$ from the first right-side gate inspection pad 70, via the right-side bundled wirings $65_2$ and $65_4$ and the right-side gate connecting wirings $64_3$, $64_4$ and $64_7$. Further, a second right-side gate inspection pad 71 is further connected to the second right-side gate inspection wiring 67. The second right-side gate inspection pad 71 is also a pad to which an inspection signal can be input. An inspection signal can thereby be input to the right-side gate extraction wirings $61_1$, $61_2$, $61_5$ and $61_6$ from the second right-side gate inspection pad 71, via the right-side bundled wirings $65_1$ and $65_3$ and the right-side gate connecting wirings $64_1$, $64_2$, $64_5$ and $64_6$.

As described above, with the active matrix substrate 2 according to the present embodiment, right-side bundled wirings $65_1$ to $65_4$ each composed of a mutually adjacent first right-side gate connecting wiring and second right-side gate connecting wiring bundled together are formed, with the right-side bundled wirings $65_2$ and $65_4$ being connected to the first right-side gate inspection wiring 66 and the right-side bundled wirings $65_1$ and $65_3$ being connected to the second right-side gate inspection wiring 67. The space between the wirings can thus be widened and the number of wiring-layer connecting portions can be reduced, in comparison with a mode in which each of the right-side gate connecting wirings $64_1$ to $64_7$ are directly connected, to the first right-side gate inspection wiring 66 or the second right-side gate inspection wiring 67 without providing the right-side bundled wirings.

That is, short circuits between the right-side bundled wirings $65_1$ to $65_4$ are unlikely to occur because the spacing between the right-side bundled wirings $65_1$ to $65_4$ (K in FIG. 3) can be widened. Also, connection failures and the like in the wiring-layer connecting portions can be reduced because of being able to reduce the number of wiring-layer connecting portions. As a result, the yield of the liquid crystal panel 1 improves because of being able to reliably inspect (for disconnection, short circuits, etc.) the active matrix substrate 2.

Also, with the active matrix substrate 2 according to the present embodiment, the forming of right-side bundled wirings $65_1$ to $65_4$ each composed of a mutually adjacent first right-side gate connecting wiring and second right-side gate connecting wiring bundled together enables the number of wirings extending over the first right-side gate inspection wiring 66 (i.e., the number of intersecting portions of the right-side bundled wirings $65_1$ to $65_4$ and the first right-side gate inspection wiring 66) to be reduced. Being able to reduce the number of intersecting portions enables the load on the first right-side gate inspection wiring 66 to be reduced. Being able to reduce the load enables the delay of inspection signals input from first right-side gate inspection pad 70 to the first right-side gate inspection wiring 66 to be reduced. As a result, fine defects, such as short circuits between picture element electrodes and source wirings 42, can be detected, because desired inspection signals can be input to the gate wirings 40 and 41.

Further, according to the active matrix substrate 2 of the present embodiment, the first right-side gate inspection wiring 66 is connected to each of the right-side bundled wirings $65_2$ and $65_4$ and the second right-side gate inspection wiring 67 is connected to each of the right-side bundled wirings $65_1$ and $65_3$. Static electricity generated in the active matrix substrate 2 can thus be eliminated or dispersed from the first right-side gate inspection wiring 66 and the second right-side gate inspection wiring 67. Being able to eliminate or disperse static electricity generated in the active matrix substrate 2 enables short circuit or disconnection due to static electricity to be suppressed, as well as suppressing changes in TFT or MIM characteristics and the like.

Note that similar effects to those described above are obtained with regard to left-side gate connecting wirings $75_1$ to $75_7$, left-side bundled wirings $76_1$ to $76_4$, a first left-side gate inspection wiring 77 and a second left-side gate inspection wiring 78 that will be described later.

Returning to FIG. 1, left-side gate extraction wirings $72_1$ to $72_7$ respectively connecting the gate terminals 51 and the input ends $44_1$ to $44_7$ for gate signals provided at the opposite end of the second gate wirings $41_1$ to $41_7$ are formed in the peripheral wiring region 6. That is, the left-side gate extraction wirings $72_1$ to $72_7$ are extracted from the input ends $44_1$ to $44_7$ for gate signals toward the second side $S_2$, formed in the peripheral wiring region 6 along the second side $S_2$, and connected to the gate terminals 51.

Here, the left-side gate extraction wirings $72_1$ to $72_7$ include first left-side gate extraction wirings $72_1$, $72_3$, $72_5$ and $72_7$ and second left-side gate extraction wirings $72_2$, $72_4$ and $72_6$. The first left-side gate extraction wirings $72_1$, $72_3$, $72_5$ and $72_7$ are extraction wirings fanned on the first layer. The second left-side gate extraction wirings $72_2$, $72_4$ and $72_6$ are extraction wirings formed on the second layer.

Here, the second left-side gate extraction wirings $72_2$, $72_4$ and $72_6$ respectively have fifth wiring-layer connecting portions $73_2$, $73_4$ and $73_6$ formed in proximity to the input ends $44_2$, $44_4$ and $44_6$ for gate signals, and sixth wiring-layer connecting portions $74_2$, $74_4$ and $74_6$ formed in proximity to the gate terminals 51. In the present embodiment, wiring of the second left-side gate extraction wirings $72_2$, $72_4$ and $72_6$ between the input ends $44_2$, $44_4$ and $44_6$ for gate signals and the fifth wiring-layer connecting portions $73_2$, $73_4$ and $73_6$ is formed on the first layer, wiring between the fifth wiring-layer connecting portions $73_2$, $73_4$ and $73_6$ and the sixth wiring-layer connecting portions $74_2$, $74_4$ and $74_6$ is formed on the second layer, and wiring between the sixth wiring-layer connecting portions $74_2$, $74_4$ and $74_6$ and the gate terminals 51 is formed on the first layer. That is, wiring formed on the first layer and wiring formed on the second layer are respectively electrically connected to the fifth wiring-layer connecting portions $73_2$, $73_4$ and $73_6$ and the sixth wiring-layer connecting portions $74_2$, $74_4$ and $74_6$.

Figure 4:
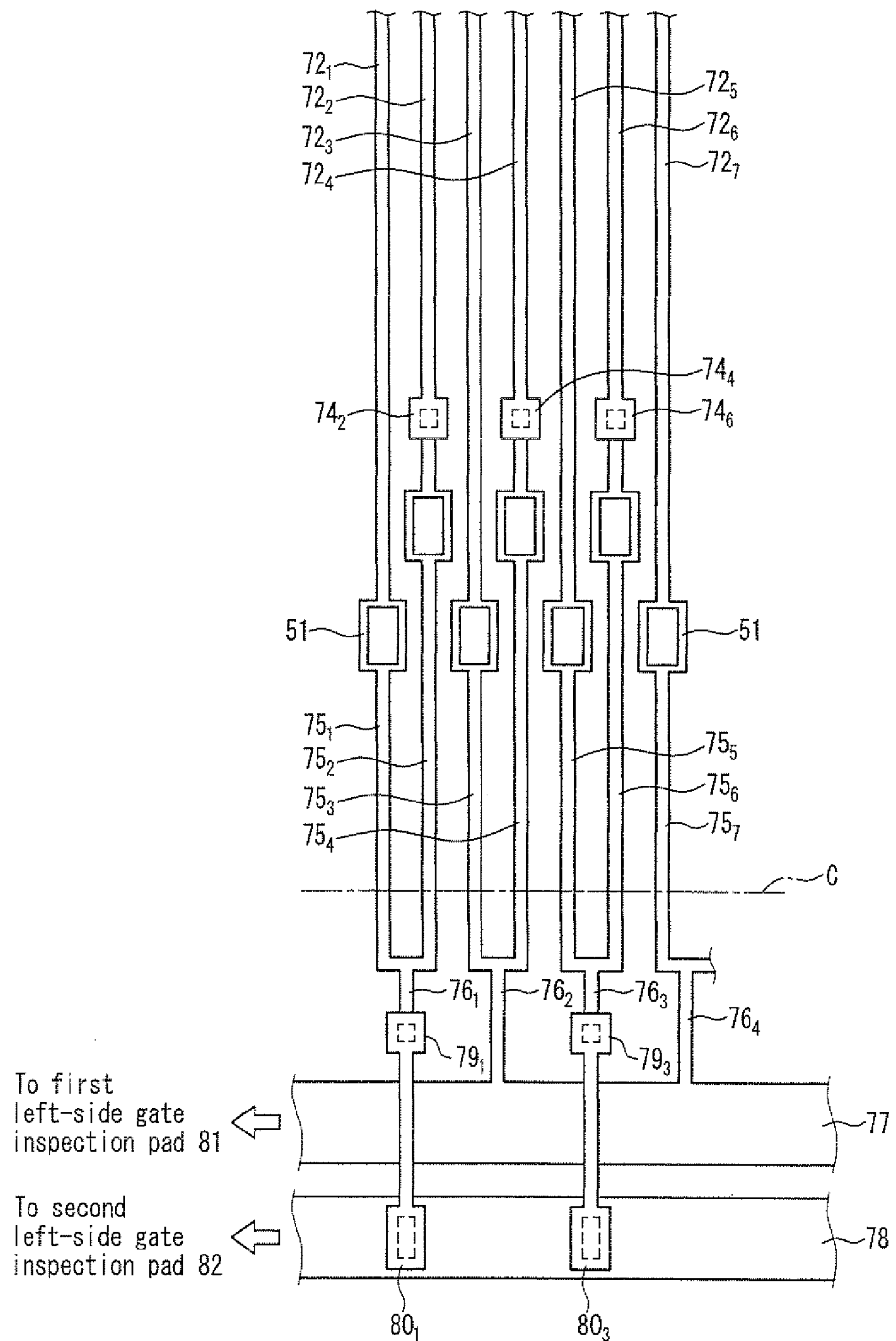
FIG. 4 is an enlarged view of an $E_2$ portion shown in FIG. 1.

FIG. 4 is an enlarged view of an $E_2$ portion shown in FIG. 1. As shown in FIG. 4, left-side gate connecting wirings $75_1$ to $75_7$ are further respectively connected to the plurality of gate terminals 51 to which the left-side gate extraction wirings $72_1$ to $72_7$ are connected. That is, the left-side gate connecting wirings $75_1$ to $75_7$ are respectively extracted from the plurality of gate terminals 51 toward the first side $S_1$ (in proximity to inspection wirings 77 and 78 described later).

Here, the left-side gate connecting wirings $75_1$ to $75_7$ include first left-side gate connecting wirings $75_1$, $75_3$, $75_5$ and $75_7$ and second left-side gate connecting wirings $75_2$, $75_4$ and $75_6$. The first left-side gate connecting wirings $75_1$, $75_3$, $75_5$ and $75_7$ are connecting wirings that are connected to gate terminals 51 to which the first left-side gate extraction wirings $72_1$, $72_3$, $72_5$ and $72_7$ are connected. The second left-side gate connecting wirings $75_2$, $75_4$ and $75_6$ are connecting wirings that are connected to gate terminals 51 to which the second left-side gate extraction wirings $72_2$, $72_4$ and $72_6$ are connected.

Left-side bundled wirings $76_1$ to $76_4$ each composed of a mutually adjacent first left-side gate connecting wiring and second left-side gate connecting wiring bundled together are formed in the peripheral wiring region 6. In the present embodiment, the left-side bundled wiring $76_1$ bundles two wirings, namely, the first left-side gate connecting wiring $75_1$ and the second left-side gate connecting wiring $75_2$ into a single wiring. Also, the left-side bundled wiring $76_2$ bundles the first left-side gate connecting wiring $75_3$ and the second left-side gate connecting wiring $75_4$ into a single wiring. Further, the left-side bundled wiring $76_3$ bundles the first left-side gate connecting wiring $75_5$ and the second left-side gate connecting wiring $75_6$ into a single wiring. Note that the left-side bundled wiring $76_4$ is only connected to the first left-side gate connecting wiring $75_7$.

A first left-side gate inspection wiring 77 is further connected to the left-side bundled wirings $76_2$ and $76_4$. A second left-side gate inspection wiring 78 is connected to the left-side bundled wirings $76_1$ and $76_3$, across the first left-side gate inspection wiring 77. That is, the first left-side gate inspection wiring 77 is an inspection wiring capable of inputting an inspection signal to the non-adjacent left-side bundled wirings $76_2$ and $76_4$ among the left-side bundled wirings $76_1$ to $76_4$. Also, the second left-side gate inspection wiring 78 is an inspection wiring capable of inputting an inspection signal to the non-adjacent left-side bundled wirings $76_1$ and $76_3$ that are not connected to the first left-side gate inspection wiring 77 among the left-side bundled wirings $76_1$ to $76_4$.

Note that because the second left-side gate inspection wiring 78 is connected to the left-side bundled wirings $76_1$ and $76_3$ over the first left-side gate inspection wiring 77, the left-side bundled wirings $76_1$ and $76_3$ respectively have seventh wiring-layer connecting portions $79_1$ and $79_3$ and eighth wiring-layer connecting portions $80_1$ and $80_3$. That is, the left-side bundled wirings $76_1$ and $76_3$ and the second left-side gate inspection wiring 78 are respectively electrically connected to the eighth wiring-layer connecting portions $\mathbf{80}_1$ and $\mathbf{80}_3$.

A first left-side gate inspection pad 81 is further connected to the first left-side gate inspection wiring 77. The first left-side gate inspection pad 81 is a pad to which an inspection signal can be input. An inspection signal can thereby be input to the left-side gate extraction wirings $\mathbf{72}_3$, $\mathbf{72}_4$ and $\mathbf{72}_7$ from the first left-side gate inspection pad 81, via the left-side bundled wirings $\mathbf{76}_2$ and $\mathbf{76}_4$ and the left-side gate connecting wirings $\mathbf{75}_3$, $\mathbf{75}_4$ and $\mathbf{75}_7$. Further, a second left-side gate inspection pad 82 is further connected to the second left-side gate inspection wiring 78. The second left-side gate inspection pad 82 is also a pad to which an inspection signal can be input. An inspection signal can thereby be input to the left-side gate extraction wirings $\mathbf{72}_1$, $\mathbf{72}_2$, $\mathbf{72}_5$ and $\mathbf{72}_6$ from the second left-side gate inspection pad 82, via the left-side bundled wirings $\mathbf{76}_1$ and $\mathbf{76}_3$ and the left-side gate connecting wirings $\mathbf{75}_1$, $\mathbf{75}_2$, $\mathbf{75}_5$ and $\mathbf{75}_6$.

Returning to FIG. 1, source extraction wirings $\mathbf{83}_1$, $\mathbf{83}_2$, $\mathbf{83}_3$, . . . $\mathbf{83}_i$ respectively connecting the source terminals 52 and the input ends $\mathbf{45}_1$, $\mathbf{45}_2$, $\mathbf{45}_3$, . . . $\mathbf{45}_i$ for source signals provided at one end of the source wirings $\mathbf{42}_1$, $\mathbf{42}_2$, $\mathbf{42}_3$, . . . $\mathbf{42}_i$ are formed in the peripheral wiring region 6. That is, the source extraction wirings 83 are extracted from the input ends 45 for source signals toward the first side $S_1$ and connected to the source terminals 52.

Here, source connecting wirings $\mathbf{84}_1$, $\mathbf{84}_2$, $\mathbf{84}_3$, . . . $\mathbf{84}_i$ are further respectively connected to the source terminals 52 to which the source extraction wirings $\mathbf{83}_1$, $\mathbf{83}_2$, $\mathbf{83}_3$, . . . $\mathbf{83}_i$ are connected. That is, the source connecting wirings $\mathbf{84}_1$, $\mathbf{84}_2$, $\mathbf{84}_3$, . . . $\mathbf{84}_i$ are respectively extracted from the plurality of source terminals 52 toward the first side $S_i$ (in proximity to inspection wirings 85 and 86 discussed later).

A first source inspection wiring 85 is further connected to source connecting wirings $\mathbf{84}_1$, $\mathbf{84}_3$, $\mathbf{84}_5$, . . . $\mathbf{84}_i$. A second source inspection wiring 86 is further connected to source connecting wirings $\mathbf{84}_2$, $\mathbf{84}_4$, $\mathbf{84}_3$, . . . $\mathbf{84}_{i-1}$. That is, the first source inspection wiring 85 is an inspection wiring capable of inputting an inspection signal to the source connecting wirings $\mathbf{84}_1$, $\mathbf{84}_3$, $\mathbf{84}_5$, . . . $\mathbf{84}_i$ that are not adjacent to each other among the plurality of source connecting wirings $\mathbf{84}_1$, $\mathbf{84}_2$, $\mathbf{84}_3$, . . . $\mathbf{84}_i$. The second source inspection wiring 86 is an inspection wiring capable of inputting an inspection signal to the source connecting wirings $\mathbf{84}_2$, $\mathbf{84}_4$, $\mathbf{84}_6$, . . . $\mathbf{84}_{i-1}$ that are not adjacent to each other and not connected to the first source inspection wiring 85 among the plurality of source connecting wirings $\mathbf{84}_1$, $\mathbf{84}_2$, $\mathbf{84}_3$, . . . $\mathbf{84}_i$.

A first source inspection pad 87 is further connected to the first source inspection wiring 85. The first source inspection pad 87 is a pad to which an inspection signal can be input. An inspection signal can thereby be input to the source extraction wirings $\mathbf{83}_1$, $\mathbf{83}_3$, $\mathbf{83}_5$, . . . $\mathbf{83}_i$ from the first source inspection pad 87 via the first source inspection wiring 85 and the source connecting wirings $\mathbf{84}_1$, $\mathbf{84}_3$, $\mathbf{84}_5$, . . . $\mathbf{84}_i$. Further, a second source inspection pad 88 is further connected to the second source inspection wiring 86. The second source inspection pad 88 is also a pad to which an inspection signal can be input. An inspection signal can thereby be input to the source extraction wirings $\mathbf{83}_2$, $\mathbf{83}_4$, $\mathbf{83}_6$, . . . $\mathbf{83}_{i-1}$ from the second source inspection pad 88 via the second source inspection wiring 86 and the source connecting wirings $\mathbf{84}_2$, $\mathbf{84}_4$, $\mathbf{84}_6$, . . . $\mathbf{84}_{i-1}$.

Further, a common inspection wiring 89 is formed in the peripheral wiring region 6, so as to enclose the right-side gate extraction wirings $\mathbf{61}_1$ to $\mathbf{61}_7$ and the left-side gate extraction wirings $\mathbf{72}_1$ to $\mathbf{72}_7$. Common electrode pads 90 and 91 are connected to the common inspection wiring 89. Transfer pads 92 and 93 are further connected to the common inspection wiring 89. The transfer pads 92 and 93 are connected to common electrodes (not shown) that are formed on the opposing substrate 3. A common voltage can thereby be applied to the common electrodes formed on the opposing substrate 3 from the common electrode pads 90 and 91.

Next, a method for manufacturing the liquid crystal panel 1 according to the present embodiment will be described. Note that, hereinafter, an inspection process of inspecting the electrical connection state of the liquid crystal panel 1 will, in particular, be described in detail.

That is, thin films such as a conductive film, an insulating film and a protective film are laminated on a transparent glass substrate to manufacture a base substrate for active matrix substrates on which are formed a plurality of active matrix substrate regions to be cut out as active matrix substrates 2. Also, thin films such as a black matrix, color filters, a conductive film and an orientation film are laminated on a transparent glass substrate to manufacture a base substrate for opposing substrates on which are formed a plurality of opposing substrate regions to be cut out as opposing substrates 3. A sealant is applied to one of the two base substrates. The two base substrates are then adhered together after the sealant has been applied.

The two base substrates adhered together are then sectioned as mother substrates from which a prescribed number (e.g., four in the horizontal direction) of liquid crystal panels 1 having an active matrix substrate 2 and an opposing substrate 3 are formed. That is, the liquid crystal panel 1 shown in FIG. 1 is a single liquid crystal panel that has been sectioned as a mother substrate into which a liquid crystal material has been injected. Accordingly, although illustration thereof has been omitted, other liquid crystal panels exist to, for example, the left and right of the liquid crystal panel 1 shown in FIG. 1. A liquid crystal material is injected into each of the liquid crystal panel 1 sectioned as mother substrates using a vacuum injection method, for example, through an inlet formed between the active matrix substrate 2 and the opposing substrate 3. Note that the liquid crystal material may be injected using a drop filling method rather than a vacuum injection method. In this case, neither the inlet nor a process of sealing the inlet portion is required.

An inspection process of inspecting the electrical connection state of the liquid crystal panel 1 is then performed, prior to attaching the driver in the terminal arrangement region 5. That is, the inspection process is for inspecting for disconnection or short circuit of wiring and for picture element electrode defects in the active matrix substrate 2 of the liquid crystal panel 1.

As for the inspection method, an inspection probe is brought into contact with each of the inspection pads 70, 71, 81, 82, 87, 88, 90 and 91, and a prescribed voltage is applied thereto, for example. Note that the order in which the inspection probe is brought into contact with the inspection pads 70, 71, 81, 82, 87, 88, 90 and 91 is not particularly limited here. An gate signal that functions as a scan signal is thereby input to the gate wirings 40 and 41. Note that this inspection signal is a signal that switches on the switching element of each picture element for a fixed period. Also, an inspection signal that functions as a source signal is input to the source wirings 42. Note that this inspection signal is a signal that orients the liquid crystal in each picture element region in a desired direction.

When the molecular orientation direction of the liquid crystal is controlled as a result of an inspection signal that functions as a source signal being input to each picture element electrode with the switching element of each picture element in an ON state, and the liquid crystal panel 1 is irradiated from the back surface thereof by irradiation means such as a backlight, for example, an image will be displayed on the display screen of the liquid crystal panel 1 corresponding to the display region 4 of the active matrix substrate 2 (hereinafter, "display screen of the liquid crystal panel 1"). Accordingly, inspection can be made for disconnection and short circuit of wiring in the active matrix substrate 2 of the liquid crystal panel 1 by, for example, an inspector visually inspecting the display screen of the liquid crystal panel 1. Note that an image recognition device may be used instead of or in addition to visual inspection by an inspector, or inspection may be performed using a detection device or the like that electrically detects disconnection or short circuit of wiring.

Here, a method for detecting short circuits of the right-side gate extraction wirings $\mathbf{61}_1$ to $\mathbf{61}_7$ will be described. Specifically, firstly, the inspection probe is brought into contact with the first source inspection pad 87, the second source inspection pad 88, and the common electrode pads 90 and 91. In this state, mutually independent inspection signals are input to the first right-side gate inspection wiring 66 and the second right-side gate inspection wiring 67. For example, the inspection probe is brought into contact with only the second right-side gate inspection pad 71 and is not brought into contact with the first right-side gate inspection pad 70. This results in an inspection signal being input to the right-side gate extraction wirings $\mathbf{61}_1$, $\mathbf{61}_2$, $\mathbf{61}_5$ and $\mathbf{61}_6$ from the second right-side gate inspection pad 71 via the right-side bundled wirings $\mathbf{65}_1$ and $\mathbf{65}_3$ and the right-side gate connecting wirings $\mathbf{64}_1$, $\mathbf{64}_2$, $\mathbf{64}_5$ and $\mathbf{64}_6$. On the other hand, because the inspection probe is not in contact with the first right-side gate inspection pad 70, an inspection signal is not input to the right-side gate extraction wirings $\mathbf{61}_3$, $\mathbf{61}_4$ and $\mathbf{61}_7$ from the first right-side gate inspection pad 70.

That is, the inspection signal is only input to the first right-side gate extraction wirings $\mathbf{61}_1$ and $\mathbf{61}_5$ among the first right-side gate extraction wirings $\mathbf{61}_1$, $\mathbf{61}_3$, $\mathbf{61}_5$ and $\mathbf{61}_7$ on the first layer (see FIG. 2). Thus, in the case where there is a short circuit between the first right-side gate extraction wirings $\mathbf{61}_1$, $\mathbf{61}_3$, $\mathbf{61}_5$ and $\mathbf{61}_7$ formed on the first layer, not only will the lines corresponding to the first gate wirings $\mathbf{40}_1$ and $\mathbf{40}_5$ connected to the first right-side gate extraction wirings $\mathbf{61}_1$ and $\mathbf{61}_5$ to which the inspection signal is input be displayed on the display screen of the liquid crystal panel 1, but lines corresponding to the first gate wirings $\mathbf{40}_3$ and $\mathbf{40}_7$ connected to the first right-side gate extraction wirings $\mathbf{61}_3$ and $\mathbf{61}_7$ to which the inspection signal is not input will also be displayed. Thus, the inspector is able to detect that there is a short circuit between the right-side gate extraction wirings $\mathbf{61}_1$, $\mathbf{61}_3$, $\mathbf{61}_5$ and $\mathbf{61}_7$ formed on the first layer.

Also, the inspection signal is only input to the second right-side gate extraction wirings $\mathbf{61}_2$ and $\mathbf{61}_6$ among the second right-side gate extraction wirings $\mathbf{61}_2$, $\mathbf{61}_4$ and $\mathbf{61}_6$ on the second layer (see FIG. 2). Thus, in the case where there is a short circuit between the second right-side gate extraction wirings $\mathbf{61}_2$, $\mathbf{61}_4$ and $\mathbf{61}_6$ formed on the second layer, not only will the lines corresponding to the first gate wirings $\mathbf{40}_2$ and $\mathbf{40}_6$ connected to the second right-side gate extraction wirings $\mathbf{61}_2$ and $\mathbf{61}_6$ to which the inspection signal is input be displayed, but lines corresponding to the first gate wiring $\mathbf{40}_4$ connected to the second right-side gate extraction wiring $\mathbf{61}_4$ to which the inspection signal is not input will also be displayed. Thus, the inspector is able to detect that there is a short circuit between the second right-side gate extraction wirings $\mathbf{61}_2$, $\mathbf{61}_4$ and $\mathbf{61}_6$ formed on the second layer.

Also, similarly to the above, the inspection probe is brought into contact with only the second left-side gate inspection pad 82 and is not brought into contact with the first left-side gate inspection pad 81, for example.

Note that in the case where the right-side gate extraction wirings $\mathbf{61}_1$ to $\mathbf{61}_7$ are disconnected, all of the lines corresponding to first gate wirings connected to disconnected right-side gate extraction wirings will not be displayed. Similarly, in the case where the left-side gate extraction wirings $\mathbf{72}_1$ to $\mathbf{72}_7$ are disconnected, all of the lines corresponding to second gate wirings connected to disconnected left-side gate extraction wirings will not be displayed on the display screen of the liquid crystal panel 1. The inspector is thereby able to detect disconnection of the right-side gate extraction wirings $\mathbf{61}_1$ to $\mathbf{61}_7$ and the left-side gate extraction wirings $\mathbf{72}_1$ to $\mathbf{72}_7$.

Also, in the case where the gate wirings 40 and 41 are disconnected, lines corresponding to gate wirings at and after the location of the disconnection will not be displayed on the display screen of the liquid crystal 1. Similarly, in the case where the source wirings 42 are disconnected, lines corresponding to source wirings at and after the location of the disconnection will not be displayed on the display screen of the liquid crystal 1. The inspector is thereby able to detect disconnection of the gate wirings 40 and 41 and the source wirings 42. Inputting mutually independent inspection signals to the first source inspection wiring 85 and the second source inspection wiring 86 enables the inspector to detect a short circuit of the source wirings 42 and the source extraction wirings 83.

Further, inputting an inspection signal having a pulse waveform desired by the inspector to the gate wirings 40 and 41 and the source wirings 42 enables short circuits to also be detected between the picture element electrodes and the source wirings 42. That is, not only inspection for short circuit and disconnection of the gate wirings 40 and 41, the source wirings 42, the right-side gate extraction wrings 61 and the left-side gate extraction wirings 72, but also inspection for defects in picture element electrodes or the like can be performed.

Once the above inspection process is finished, a cutting off process of cutting off the right-side gate connecting wirings $\mathbf{64}_1$ to $\mathbf{64}_7$ and the left-side gate connecting wirings $\mathbf{75}_1$ to $\mathbf{75}_7$ is performed. Specifically, the right-side gate connecting wirings $\mathbf{64}_1$ to $\mathbf{64}_7$ are cut off along the cutline C shown in FIG. 3, for example, using a laser. Electrical continuity is thereby no longer established between the gate terminals 51 respectively connected to the first right-side gate extraction wirings $\mathbf{61}_1$, $\mathbf{61}_3$, $\mathbf{61}_5$ and $\mathbf{61}_7$ and the gate terminals 51 respectively connected to the second right-side gate extraction wirings $\mathbf{61}_2$, $\mathbf{61}_4$ and $\mathbf{61}_6$. Also, the left-side gate connecting wirings $\mathbf{75}_1$ to $\mathbf{75}_7$ are cut off along the cutline C shown in FIG. 4, for example, using a laser. Electrical continuity is thereby no longer established between the gate terminals 51 respectively connected to the first left-side gate extraction wirings $\mathbf{72}_1$, $\mathbf{72}_3$, $\mathbf{72}_5$ and $\mathbf{72}_7$ and the gate terminals 51 respectively connected to the second left-side gate extraction wirings $\mathbf{72}_2$, $\mathbf{72}_4$ and $\mathbf{72}_6$.

Figure 5:
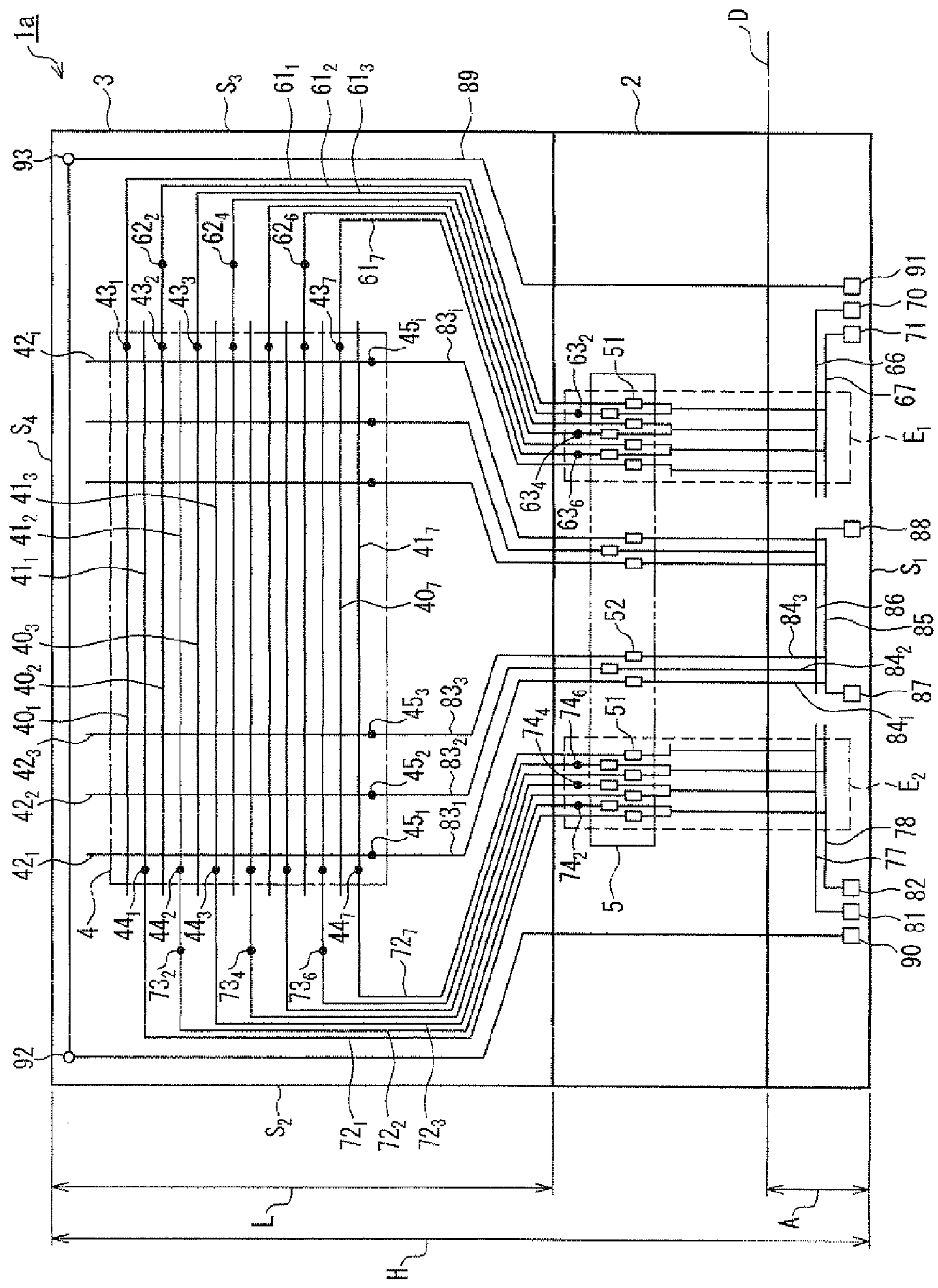
FIG. 5 is a plan, view showing a schematic configuration of a liquid crystal panel according to a modification.

Note that while an example in which the connecting wirings are cut off along the cutline C using a laser was described above, the connecting wirings may, in the case of a liquid crystal panel 1*a* such shown in FIG. 5, for example, be divided at the same time as the substrates using a wheel cutter, for example, along a division line D. In this case, the process of manufacturing a liquid crystal panel is simplified, because the connecting wirings do not need to cut off along the cutline C using a laser. Also, the profile of the liquid crystal panel to be installed in the display device can be reduced, because the A portion of the substrate in FIG. 5 on which the inspection pads 70, 71, 81, 82, 87, 88, 90 and 91 are formed is separated.

Once the cutting off process is finished, a mounting process of mounting a driver for driving and controlling the gate wirings 40 and 41 and the source wirings 42 in the terminal arrangement region 5 is performed. Subsequently, the individual liquid crystal panels 1 are then cut out from the mother board. An optical film such as a polarizer is adhered to the cut out liquid crystal panels 1. Liquid crystal panels 1 are thereby manufactured. Note that the method for manufacturing the liquid crystal panel 1 is not intended to be limited to the above method. For example, with a monochrome liquid crystal panel, color filters need not be laminated on the opposing substrate. Also, the inspection process and the mounting process may be performed after the individual liquid crystal panels have been cut out.

As discussed above, according to the active matrix substrate 2 in the present embodiment, short circuits between adjacent extraction wirings formed on the same layer (first right-side gate extraction wirings, second right-side gate extraction wirings, first left-side gate extraction wirings, second left-side gate extraction wirings) can be reliably detected with a simple configuration in the case where extraction wirings are formed on each of a plurality of layers.

Embodiment 2

Figure 6:
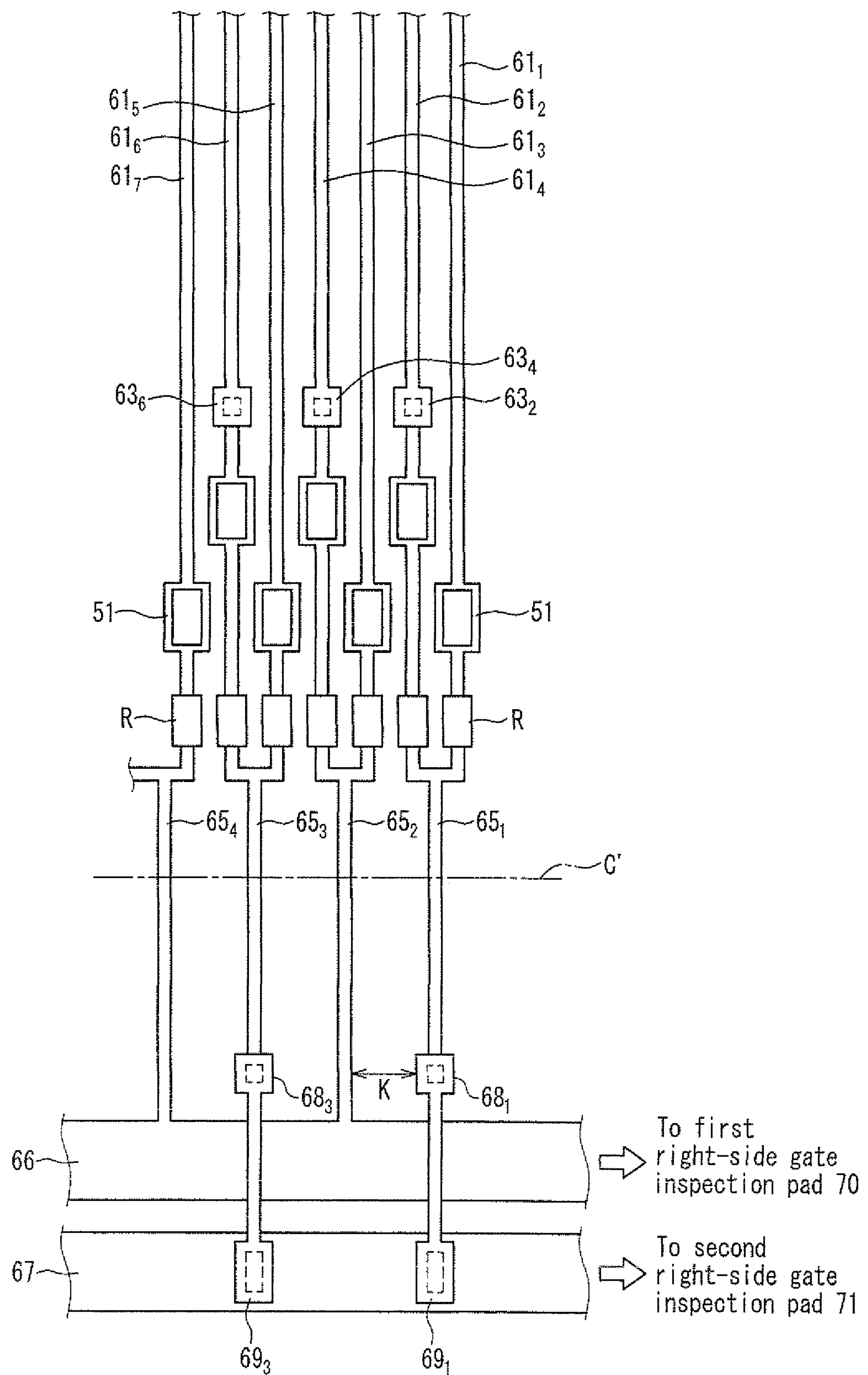
FIG. 6 is an enlarged view of the same portion as the $E_1$ portion shown in FIG. 1.

FIG. 6 is an enlarged view of the same portion as the $E_1$ portion shown in FIG. 1. As shown in FIG. 6, a resistance element R is further connected to each of the right-side gate connecting wirings $\mathbf{64}_1$ to $\mathbf{64}_7$ according to the present embodiment. Here, resistance elements R are, for example, constituted by patterns formed by ITO, IZO or the like to be used as pixel electrodes, patterns formed with a TFT semiconductor film, diodes, transistors, arbitrary patterns and the like. Note that a resistance element R is also further connected to each of the left-side gate connecting wirings $\mathbf{75}_1$ to $\mathbf{75}_7$ according to the present embodiment.

Hereinafter, the respective cases of the right-side gate connecting wirings $\mathbf{64}_1$ to $\mathbf{64}_7$ and the right-side bundled wirings $\mathbf{65}_1$ to $\mathbf{65}_4$ will be described, with the description similarly applying to the cases of the left-side gate connecting wirings $\mathbf{75}_1$ to $\mathbf{75}_7$ and left-side bundled wirings $\mathbf{76}_1$ to $\mathbf{76}_4$.

That is, since a resistance elements R is connected to each of the right-side gate connecting wirings $\mathbf{64}_1$ to $\mathbf{64}_7$, the right-side bundled wirings $\mathbf{65}_1$ to $\mathbf{65}_4$ can be cut off instead of the right-side gate connecting wirings $\mathbf{64}_1$ to $\mathbf{64}_7$ in the cutting off process. Specifically, the right-side bundled wirings $\mathbf{65}_1$ to $\mathbf{65}_4$ are cut off using a laser along a cutline C' shown in FIG. 6, for example. Note that similarly to Embodiment 1, the right-side bundled wirings $\mathbf{65}_1$ to $\mathbf{65}_4$ may be divided at the same time as the substrates using a wheel cutter, for example, along a division line.

Thus, in the present embodiment, because the right-side bundled wirings $\mathbf{65}_1$ to $\mathbf{65}_4$ are cut off, the number of wirings to be cut off is fewer than in the case where the right-side gate connecting wirings $\mathbf{64}_1$ to $\mathbf{64}_7$ are cut off, such as in Embodiment 1. As a result, the time taken in the cutting off process can be decreased.

In the present embodiment, electrical continuity will be established between the gate terminals 51 to which the first right-side gate extraction wirings $\mathbf{61}_1$, $\mathbf{61}_3$, $\mathbf{61}_5$ and $\mathbf{61}_7$ are respectively connected and the gate terminals 51 to which the second right-side gate extraction wirings $\mathbf{61}_2$, $\mathbf{61}_4$ and $\mathbf{61}_6$ are respectively connected, even if the right-side bundled wirings $\mathbf{65}_1$ to $\mathbf{65}_4$ are cut off. However, if the values of the resistance elements R respectively connected to the right-side gate connecting wirings $\mathbf{64}_1$ to $\mathbf{64}_7$ are set sufficiently high, operation of an electronic device will be problem free even in the case where the liquid crystal panel 1 according to the present embodiment is incorporated in the electronic device. Also, even in the inspection process of inspecting the electrical connection state of the liquid crystal panel 1, inspection can be performed without problem because an inspection signal need only be input from each inspection pad such that the various wirings (gate wirings, source wirings, extraction wirings, etc.) reach a desired potential.

Specifically, the electrical influence received from adjacent wirings lessens if the value of the resistance elements R is from a few dozen to a few hundred megohms. More specifically, the influence of a change in potential of no more than a few percent (e.g., 1%) is received. If the change in potential is within a few percent, the influence on display and the charging rate of the picture element electrodes will be negligible. If the value of the resistance elements R is from a few dozen to a few hundred megohms, operation of an electronic device will be problem free even in the case where the liquid crystal panel 1 according to the present embodiment is incorporated in the electronic device. If the value of the resistance elements R is more than a few hundred megohms, eliminating charge stored in the wirings and the picture element electrodes after performing the inspection process becomes problematic. As a result, short circuit or disconnection of wirings, changes in the TFT or MIM characteristics, and the like occur due to the charge stored in the wirings and the picture element electrodes, and display quality deteriorates. Therefore, the value of the resistance elements R preferably is from a few dozen to a few hundred megohms, as described above. Note that the value of the resistance elements R is arbitrarily selected from a range of a few dozen to a few hundred megohms, depending on the size of the display region 4 and the pixel count.

Since a resistance element R is connected to each of the right-side gate connecting wirings $\mathbf{64}_1$ to $\mathbf{64}_7$, invasion of static electricity into the display region 4 can be prevented as a result of the resistance elements R functioning as a protective element against static electricity, in the case where static electricity invades from the first right-side gate inspection wiring 66 or the second right-side gate inspection wiring 67. The display quality of the liquid crystal panel 1 thereby improves, as does the yield of liquid crystal panels.

Note that the value of the resistance elements R connected to the first right-side gate connecting wirings $\mathbf{64}_1$, $\mathbf{64}_3$, $\mathbf{64}_5$ and $\mathbf{64}_7$ and the value of the resistance elements R connected to the second right-side gate connecting wirings $\mathbf{64}_2$, $\mathbf{64}_5$ and $\mathbf{64}_6$ preferably are substantially the same. That is, if the values of the resistance elements R respectively connected to adjacent connecting wirings are substantially the same, the delay amounts of inspection signals to be input to extraction wirings corresponding to adjacent connecting wirings and to gate wirings corresponding to the extraction wirings will be substantially equivalent. If the wirings on the active matrix substrate 2 are normal, substantially equivalent display will be performed on the display screen of the liquid crystal panel 1. In other words, if substantially equivalent display is not performed, the inspector is able to detect a failure that, while not resulting in disconnection, occurs in cases such as when the wiring width is extremely small.

Note that while an example in which a resistance element is connected to each of two mutually adjacent connecting wirings was described in Embodiment 2, the present invention is not limited thereto. That is, the resistance elements need only be connected to at least one of mutually adjacent connecting wirings.

Also, in Embodiments 1 and 2, an example was described in which common electrodes are formed on the opposing substrate and a common voltage is applied to the common electrodes on the opposing substrate, but the present invention is not limited thereto. For example, the present invention can, naturally, also be applied to an IPS (In-Plane Switching) mode liquid crystal panel in which common electrodes are formed on an active matrix substrate. Here, transfer pads need not be formed on the active matrix substrate of an IPS mode liquid crystal panel. The present invention can, naturally, also be applied to an MVA (Multi-Domain Vertical Aligned) mode liquid crystal panel, an OCB (Optically Compensated Bend) mode liquid crystal panel, or the like.

Also, in Embodiments 1 and 2, an example was described in which R source wirings, G source wirings and B source wirings are formed in the display region, but the present invention is not limited thereto. That is, R gate wirings, G gate wirings and B gate wirings may be formed in the display region. In this case, source wirings need net be provided per RGB.

Also, there may be a plurality of colors corresponding to pixels connected to each gate wiring, and there may be a plurality of colors corresponding to pixels connected to each source wiring.

Also, the arrangement of the pixels in the display region is not limited to a stripe pattern. For example, a so-called delta arrangement whereby the disposition pitch shifts every line may be applied.

Also, the method of inputting inspection signals to the gate wirings and the source wirings is not limited to those illustrated in FIGS. 1 and 5. Inspection signals may be input to a gate wiring or a source wiring from an inspection pad via a switching element such as a TFT. Also, the driving circuit of the gate wirings and the source wirings may be formed directly on the active matrix substrate. This driving circuit may be driven at the time of inspection.

Further, in Embodiments 1 and 2, an example was described in which inspection pads are formed on the active matrix substrate, but the present invention is not limited thereto. For example, a configuration may be adopted in which the inspection pads are formed on a different substrate from the active matrix substrate, and only inspection wirings to which inspection signals supplied from the inspection pads can be input are formed on the active matrix substrate.

That is, the present invention is not intended to be limited to the abovementioned embodiments and various modifications are possible within the scope defined by the claims. In other words, embodiments combining technical means appropriately modified within the scope defined by the claims are encompassed in the technical scope of the present invention.

INDUSTRIAL APPLICABILITY

As described above, the present invention is useful as an active matrix substrate, a display device, a method for inspecting an active matrix substrate, and a method for inspecting a display device that enable short circuits between adjacent extraction wirings formed on the same layer to be reliably detected with a simple configuration in the case where extraction wirings are formed on each of a plurality of layers.

The invention claimed is:

1. An active matrix substrate comprising:

a plurality of first wirings formed parallel to each other in a display region;

a plurality of second wirings formed parallel to each other and so as to intersect the plurality of first wirings in the display region;

a plurality of first terminals arranged in a terminal arrangement region;

a plurality of second terminals arranged in the terminal arrangement region;

a plurality of first extraction wirings respectively connecting the plurality of first wirings and the plurality of first terminals; and a plurality of second extraction wirings respectively connecting the plurality of second wirings and the plurality of second terminals, wherein the plurality of first extraction wirings include a plurality of third extraction wirings and a plurality of fourth extraction wirings, the third extraction wirings being formed on the same layer as a layer on which the first wirings are formed, at least a portion of the fourth wirings being formed on a different layer from the layer on which the first wirings are formed with an insulating material sandwiched therebetween, and the third extraction wirings and the fourth extraction wirings being formed alternately per wiring in a peripheral wiring region that is other than the display region and the terminal arrangement region, and the active matrix substrate comprises:

a plurality of first connecting wirings respectively connected to a plurality of first terminals to which the plurality of third extraction wirings are respectively connected;

a plurality of second connecting wirings respectively connected to a plurality of first terminals to which the plurality of fourth extraction wirings are respectively connected;

a plurality of bundled wirings each composed of a mutually adjacent first connecting wiring and second connecting wiring bundled together;

a first common wiring commonly connecting bundled wirings that are not adjacent to each other among the plurality of bundled wirings; and a second common wiring commonly connecting bundled wirings that are not adjacent to each other and not connected to the first common wiring among the plurality of bundled wirings.

2. The active matrix substrate according to claim 1, wherein the plurality of first connecting wirings and the plurality of second connecting wirings have been cut off, such that electrical continuity is not established between the plurality of first terminals to which the plurality of third extraction wirings are respectively connected and the plurality of first terminals to which the plurality of fourth extraction wirings are respectively connected.

3. The active matrix substrate according to claim 1, wherein a resistance element is connected to at least one of a mutually adjacent first connecting wiring and second connecting wiring.

4. The active matrix substrate according to claim 3, wherein a resistance element is connected to each of the mutually adjacent first connecting wiring and second connecting wiring.

5. The active matrix substrate according to claim 4, wherein the resistance element connected the first connecting wiring and the resistance element connected the second connecting wiring have substantially the same resistance value.

6. The active matrix substrate according to claim 3, wherein each of the plurality of bundled wirings has been cut off.

7. The active matrix substrate according to claim 1, wherein the first wirings are gate wirings and the second wirings are source wirings.

8. The active matrix substrate according to claim 1, wherein the first wirings are source wirings and the second wirings are gate wirings.

9. A display device comprising the active matrix substrate according to claim 1.

10. The display device according to claim 9, wherein the display device is a liquid crystal display device.

11. A method for inspecting the active matrix substrate according to claim 1 or a display device including the active matrix substrate according to claim 1, comprising the steps of:

inspecting the third extraction wirings and the fourth extraction wirings by inputting mutually independent inspection signals to the first common wiring and the second common wiring; and cutting off the plurality of first connecting wirings and the plurality of second connecting wirings after the inspection step.

12. A method for inspecting the active matrix substrate according to claim 3 or a display device including the active matrix substrate according to claim 3, comprising the steps of:

inspecting the third extraction wirings and the fourth extraction wirings by inputting mutually independent inspection signals to the first common wiring and the second common wiring; and cutting off the plurality of bundled wirings after the inspection step.

* * * * *